(12) United States Patent
Mariani et al.

(10) Patent No.: US 8,154,006 B2
(45) Date of Patent: Apr. 10, 2012

(54) CONTROLLING THE CIRCUITRY AND MEMORY ARRAY RELATIVE HEIGHT IN A PHASE CHANGE MEMORY FEOL PROCESS FLOW

(75) Inventors: Marcello Mariani, Milan (IT); Lorenzo Fratin, Buccinasco (IT); Anna Rita Odorizzi, Lecco (IT); Michele Magistretti, Gessate (IT)

(73) Assignee: Micron Technology, Inc., Boise, ID (US)

( * ) Notice: Subject to any disclaimer, the term of this patent is extended or adjusted under 35 U.S.C. 154(b) by 412 days.

(21) Appl. No.: 12/345,102

(22) Filed: Dec. 29, 2008

(65) Prior Publication Data

US 2010/0163835 A1    Jul. 1, 2010

(51) Int. Cl.
*H01L 45/00* (2006.01)

(52) U.S. Cl. .......... 257/5; 257/4; 257/E45.002; 365/148
(58) Field of Classification Search ............... 257/4, 5, 257/E45.002, E45.003; 365/148
See application file for complete search history.

(56) References Cited

U.S. PATENT DOCUMENTS

| | | | |
|---|---|---|---|
| 7,005,665 B2 * | 2/2006 | Furkay et al. ............... 257/2 |
| 2006/0151771 A1 * | 7/2006 | Asano et al. ................ 257/2 |
| 2007/0254446 A1 * | 11/2007 | Pellizzer et al. ........... 438/309 |

* cited by examiner

*Primary Examiner* — Benjamin Sandvik
*Assistant Examiner* — Scott Stowe
(74) *Attorney, Agent, or Firm* — Schwegman, Lundberg & Woessner, P.A.

(57) ABSTRACT

A CMOS logic portion embedded with a PCM portion is recessed by a gate structure height as measured by a thickness of a gate oxide and a polysilicon gate to provide planarity of the CMOS logic portion with the PCM portion is described.

13 Claims, 7 Drawing Sheets

CONTROLLING THE CIRCUITRY AND MEMORY ARRAY RELATIVE HEIGHT IN A PHASE CHANGE MEMORY FEOL PROCESS FLOW

TECHNICAL FIELD

Embodiments of the present invention relate to memory and more specifically to Phase Change Memory (PCM).

BACKGROUND OF THE INVENTION

PCM is a promising nonvolatile memory technology for the next generation due to favorable write speeds, small cell sizes, and simpler circuitries. PCM is based on a phase transition of a chalcogenide material that may be programmed by resistive heating with current pulses that transition the memory cell into high and low resistance states. Processing improvements are needed to improve fabrication compatibility of the PCM process with the Complementary Metal-Oxide-Semiconductor (CMOS) process that embeds storage devices with combinational logic devices.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

It will be appreciated that for simplicity and clarity of illustration, elements illustrated in the figures have not necessarily been drawn to scale. For example, the dimensions of some of the elements may be exaggerated relative to other elements for clarity. Further, where considered appropriate, reference numerals have been repeated among the figures to indicate corresponding or analogous elements.

DETAILED DESCRIPTION

In the following detailed description, numerous specific details are set forth in order to provide a thorough understanding of the invention. However, it will be understood by those skilled in the art that the present invention may be practiced without these specific details. In other instances, well-known methods, procedures, components and circuits have not been described in detail so as not to obscure the present invention.

Figure 1:
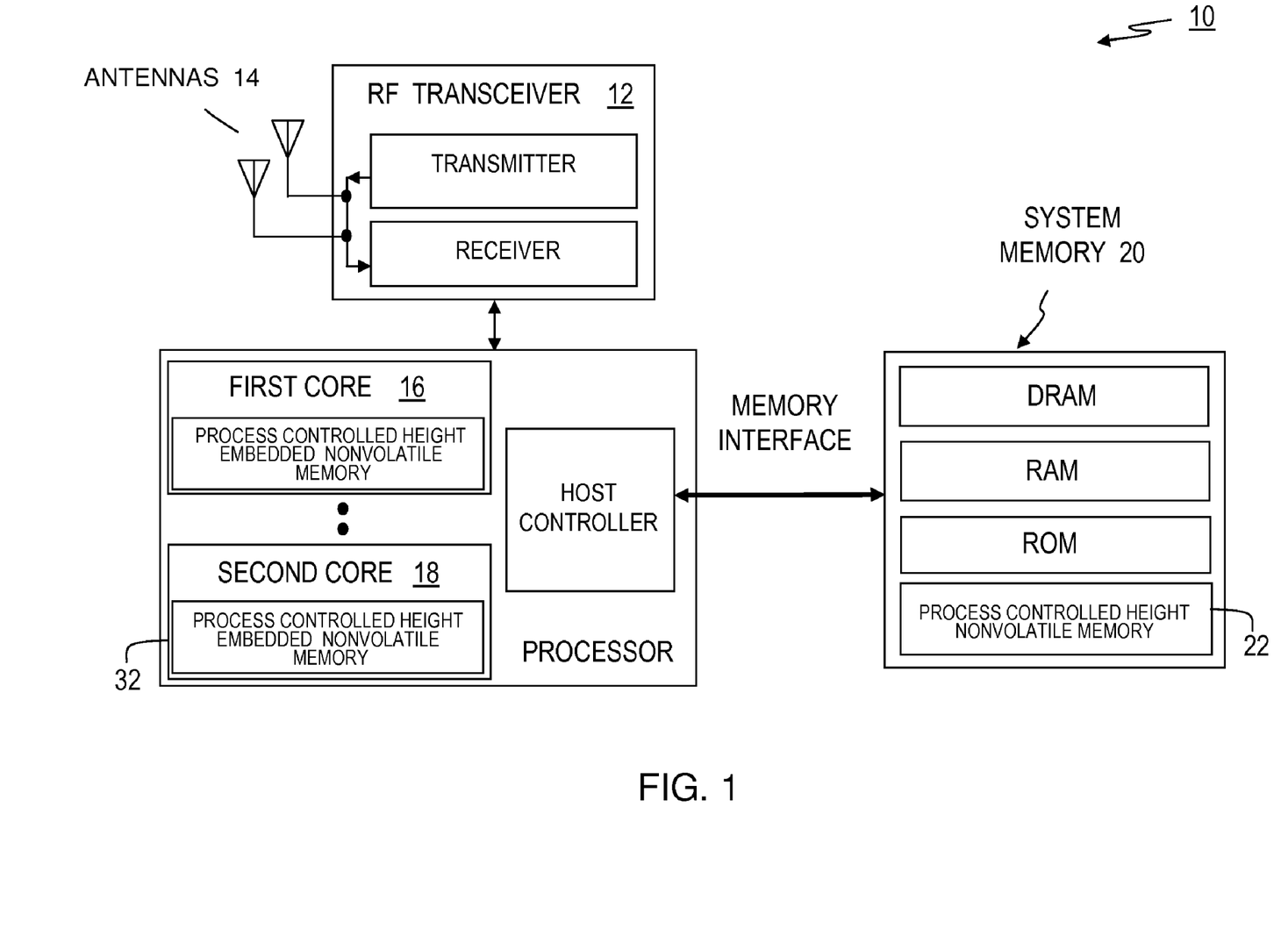
FIG. 1 illustrates a wireless architecture with process flow steps to fabricate Phase Change Memory (PCM) at approximately the same height level as CMOS logic in accordance with the present invention.

The embodiment illustrated in FIG. 1 shows a communications device 10 with an embedded Phase Change Memory (PCM) that utilizes manufacturing steps in accordance with the present invention to control the relative height of the CMOS circuitry and the memory array. Communications device 10 may include one or more antenna structures 14 to allow radios to communicate with other over-the-air communication devices. As such, communications device 10 may operate as a cellular device or a device that operates in wireless networks such as, for example, Wireless Fidelity (Wi-Fi), WiMax and Mobile WiMax, Wideband Code Division Multiple Access (WCDMA), and Global System for Mobile Communications (GSM) networks, although the present invention is not limited to operate in only these networks. The radio subsystems collocated in the same platform of communications device 10 provide the capability of communicating with different frequency bands in an RF/location space with other devices in a network.

The embodiment illustrates the coupling of antenna structure 14 to a transceiver 12 to accommodate modulation/demodulation. In general, analog front end transceiver 12 may be a stand-alone Radio Frequency (RF) discrete or integrated analog circuit, or transceiver 12 may be embedded with a processor having one or more processor cores 16 and 18. The multiple cores allow processing workloads to be shared across the cores and handle baseband functions and application functions. Data and instructions may transfer through an interface between the processor and memory storage in a system memory 20.

Although the figure illustrates a wireless architecture it should be noted that the present invention may be used in embodiments that do not include over-the-air communications. For example, system memory 20 may include both volatile and a nonvolatile memory 22 having a phase change material. Nonvolatile memory 22 or 32 also includes CMOS circuitry to control the modes of operation of the memory array and any other functionality provided by the memory. Thus, nonvolatile memory 22 or 32 may also utilize manufacturing steps in accordance with the present invention to control the relative height of the CMOS circuit portion and the memory array portion having the phase change material.

Figure 2:
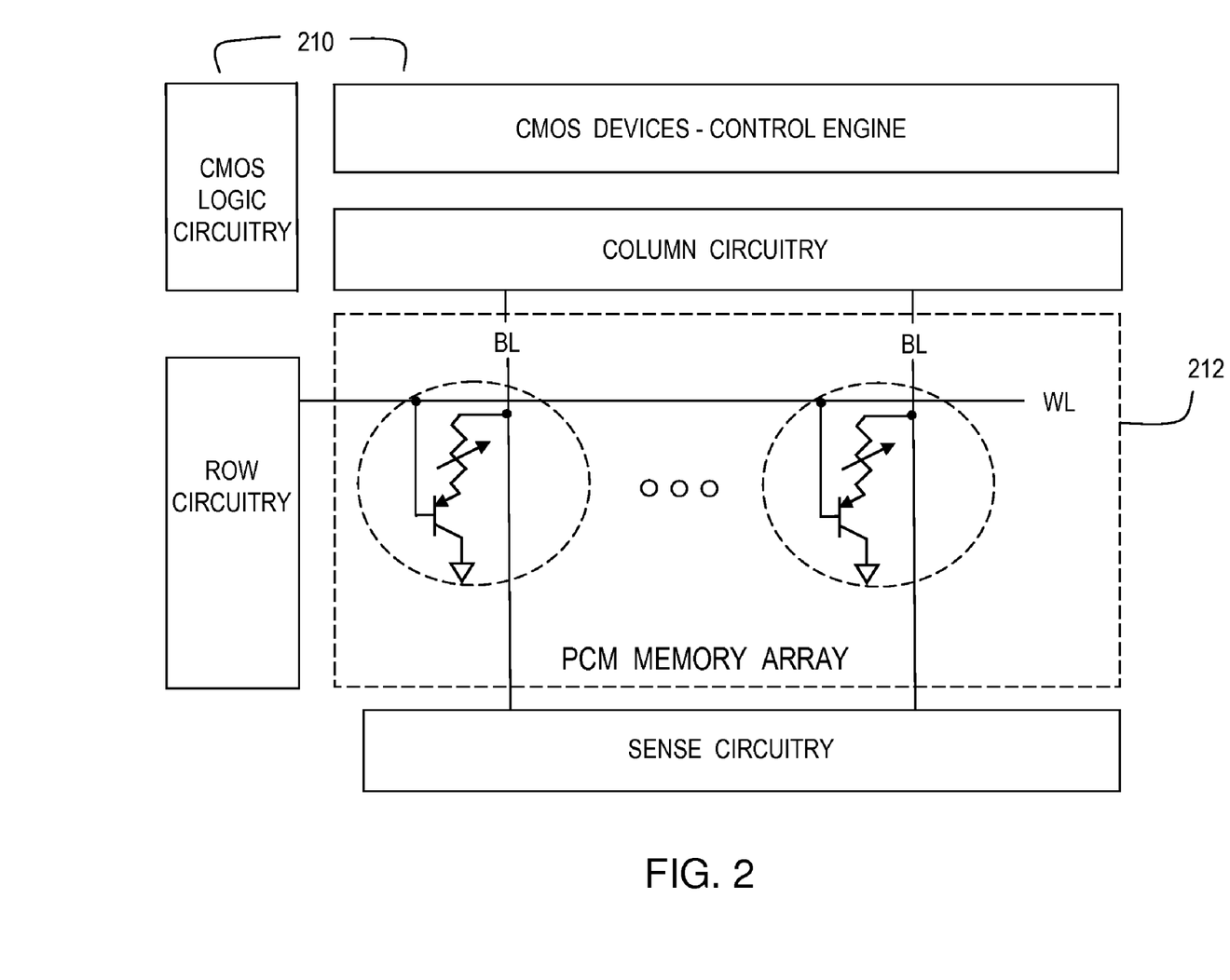
FIG. 2 illustrates a PCM memory array integrated with CMOS logic circuitry using the process flow steps to eliminate a height difference that exists in fabricating the CMOS transistors and the BJT selectors.

FIG. 2 illustrates a phase change memory with CMOS transistors in a circuit portion 210 and Bipolar Junction Transistor (BJT) selectors located in a memory array portion 212. Conventional processing results in gate structures of the CMOS devices in the CMOS portion that are formed above the top surface of the substrate, whereas the integrated BJT selectors have emitter, base, and collector regions formed below that surface of the substrate. Thus, the conventional fabrication process results in CMOS gates being at a higher height than the array selectors. The height disparity may cause serious constraints on planarity, especially in deep submicron technologies needed to build memory elements, contacts, and interconnections.

The PCM cells include the alloys of elements of group VI of the periodic table; elements such as Te or Se for example are referred to as chalcogenides or chalcogenic materials. Chalcogenides may be used advantageously in phase change memory cells to provide data retention and remain stable even after the power is removed from the nonvolatile memory. Taking the phase change material as Ge2Sb2Te5 for example, two phases are exhibited having distinct electrical characteristics useful for memory storage, i.e., an amorphous phase (reset state) showing a high resistance and a crystalline phase (set state) showing a low resistance.

Figure 3:
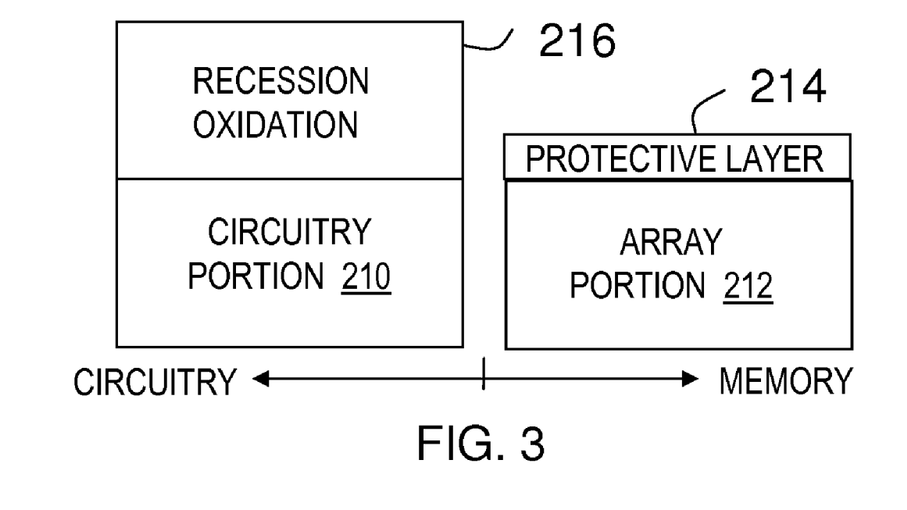
FIG. 3 illustrates a silicon wafer having a circuitry portion for forming CMOS transistors and an array portion for forming BJT selectors that is covered by a protective layer to allow the circuitry portion to be recessed.

FIG. 3 illustrates a cross-sectional view of a silicon wafer having a circuitry portion 210 for forming CMOS transistors and an array portion 212 for forming BJT selectors in combination with phase change materials. As shown, the array portion 212 is covered by a protective layer 214, e.g. nitride, and then the circuitry portion 210 is recessed. The nitride mask covers the selected portions of the memory array where no oxide is to be grown and is a protective layer that is impervious to oxidant. However, on the circuitry portion 210 the controlled oxidation grows oxide on selected parts of the silicon surface. By way of example, the recession may be obtained by a selective oxidation where an appropriate amount of silicon oxide 216 is grown in the circuitry portion 210 and then etched away. The recessed oxidation isolation structures relate to introducing diffused regions under the recessed oxide isolation structures.

Alternative to the circuitry portion 210 being recessed, an anisotropic wet etching process, e.g. tetramethylammonium hydroxide (TMAH), may be used as an anisotropic etchant to recess silicon on the circuitry portion 210. Still another alternative is dry etching that uses a photo-resist process to mask the array portion 212 instead of using the protective layer 214.

Figure 4:
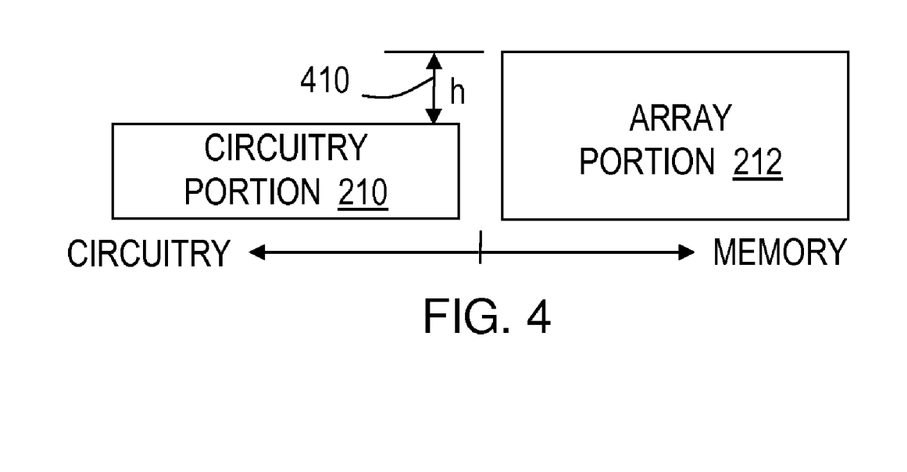
FIG. 4 shows the circuitry portion recessed by a height "h"

In accordance with features of the present invention, specific changes made to the process flow help eliminate the height difference that otherwise would exist in fabricating the CMOS transistors and the BJT selectors. FIG. 4 shows a step 410 having a height "h" that purposefully exists following the recession in the circuitry portion 210. When the silicon oxide is etched away, the remaining height difference between circuitry portion 210 and array portion 212 as measured by step 410 is a predetermined value by design in accordance with the present invention. Specifically, the height "h" of step 410 is set to equal the sum of the thickness of the CMOS gate oxide and the thickness of the polysilicon CMOS gate. Thus, the silicon oxide is etched a predetermined, known thickness that substantially matches the height of the CMOS gate structure that comprises the gate oxide combined with the gate polysilicon.

Figure 5:
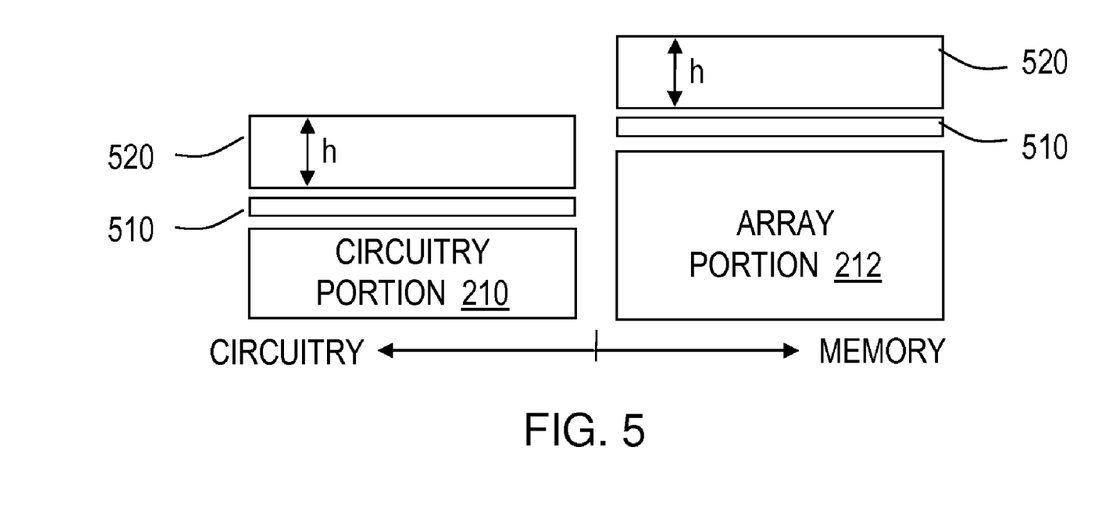
FIG. 5 illustrates a nitride hard mask that may be used to isolate active areas of logic in the circuitry portion or memory cells in the array portion.

FIG. 5 shows a nitride layer 510 deposited over a pad oxide and a buffer oxide deposited in both the circuitry portion 210 and the array portion 212 and used to separate nitride layer 510 from a deposited nitride layer 520 having a thickness of "h".

Figure 6:
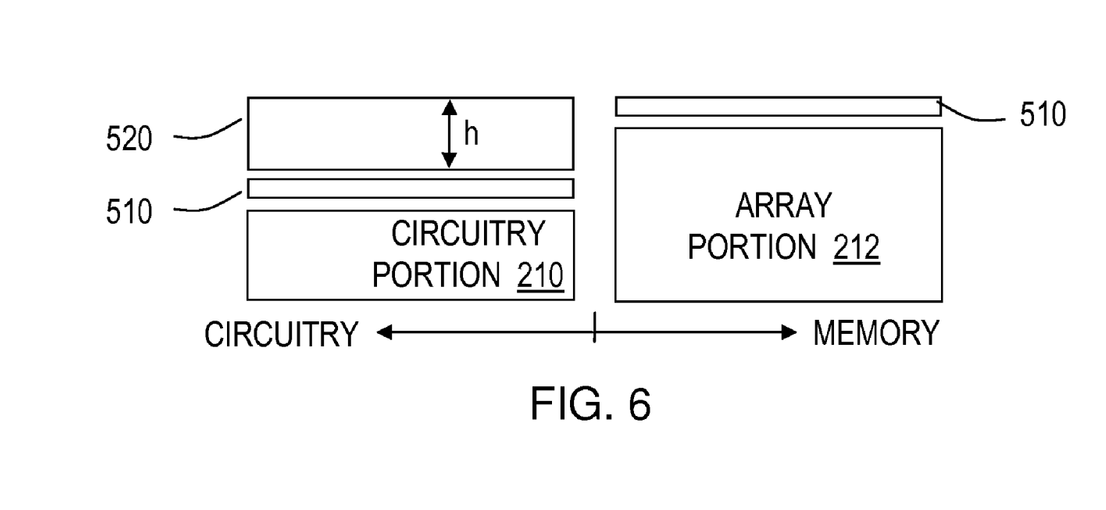
FIG. 6 shows the second nitride layer removed from the array portion.

FIG. 6 shows the second nitride layer, i.e., nitride layer 520, removed from the array portion 212 only. The nitride layer 510 over the array portion 212 acts as a stopping layer for the CMP process. A standard STI process flow that includes trench digging, sidewall oxidation, gap filling, and field oxide CMP is then performed on the circuitry portion 210.

Figure 7:
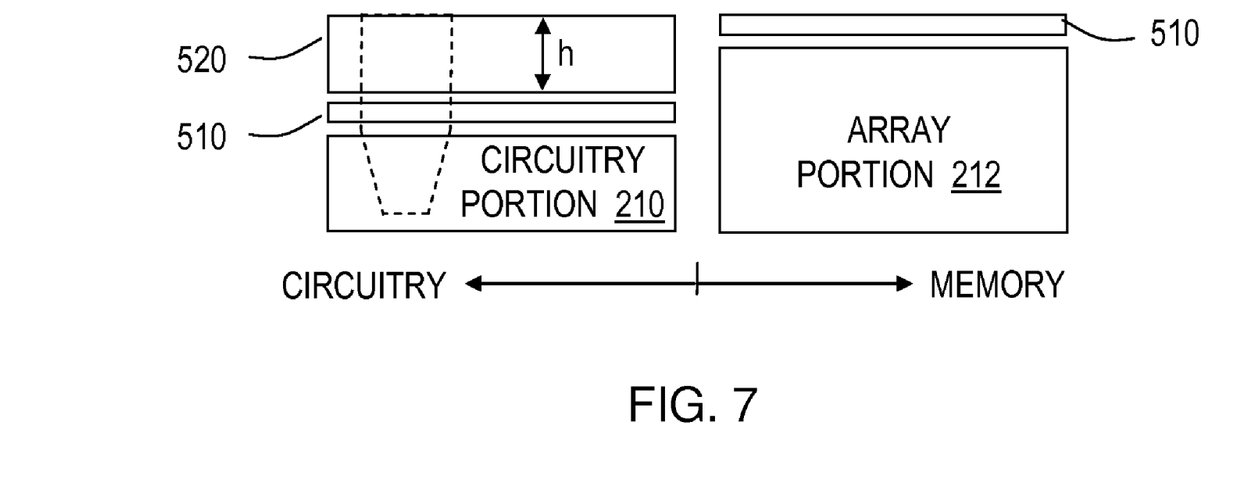
FIG. 7 shows a field oxide deposited in the circuitry portion.

FIG. 7 shows that the nitride layer 510 over the array portion 212 acts as a stopping layer for the CMP process.

Figure 8:
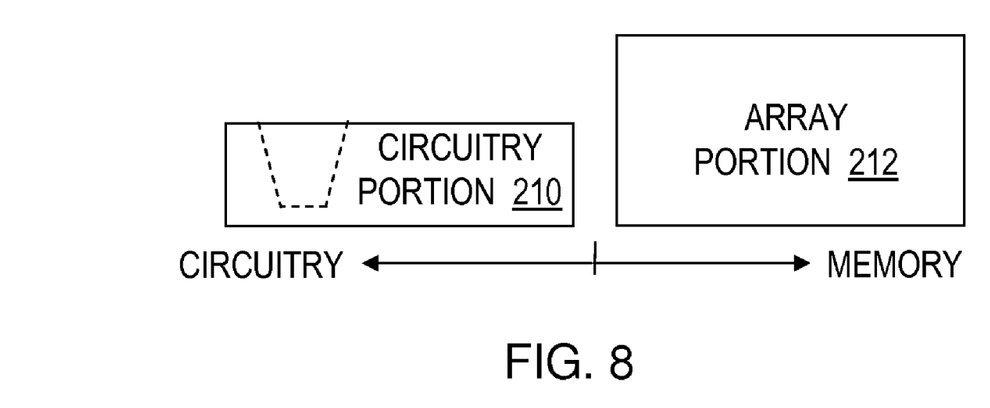
FIG. 8 shows the nitride hard mask layers on the circuitry portion and on the array portion having been removed.
Figure 9:
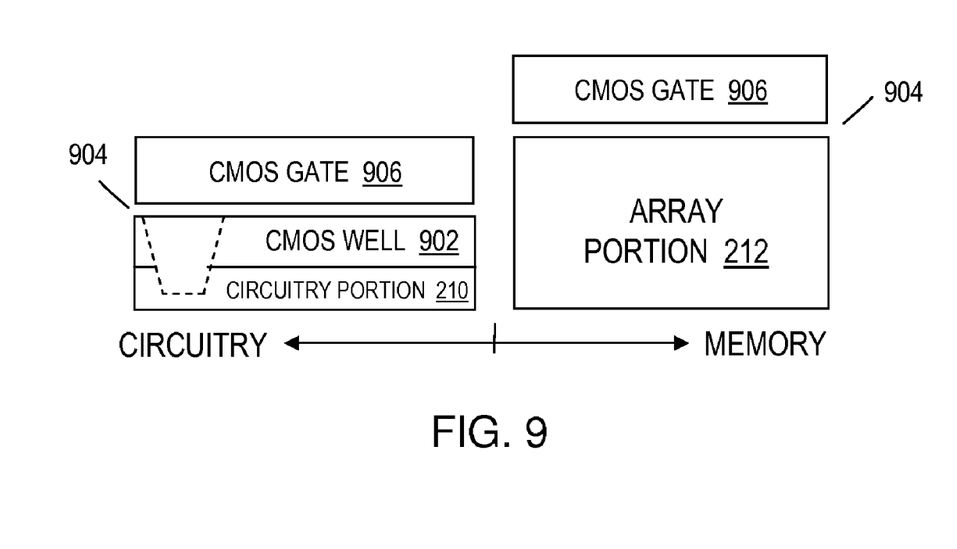
FIG. 9 shows the formation of a CMOS well, CMOS gate oxide, and a CMOS gate poly-silicon layer.

FIG. 8 shows the STI nitride hard mask, i.e., nitride layers 510 and 520 on the circuitry portion 210 and nitride later 510 on the array portion 212, having been removed. FIG. 9 shows the process flow proceeding in a standard way with the formation of CMOS wells 902, CMOS gate oxide 904, and CMOS gate poly-silicon layer 906 deposited in circuitry portion 210. The CMOS gate oxide 904 and CMOS gate poly-silicon layer 906 is also deposited in array portion 212.

Figure 10:
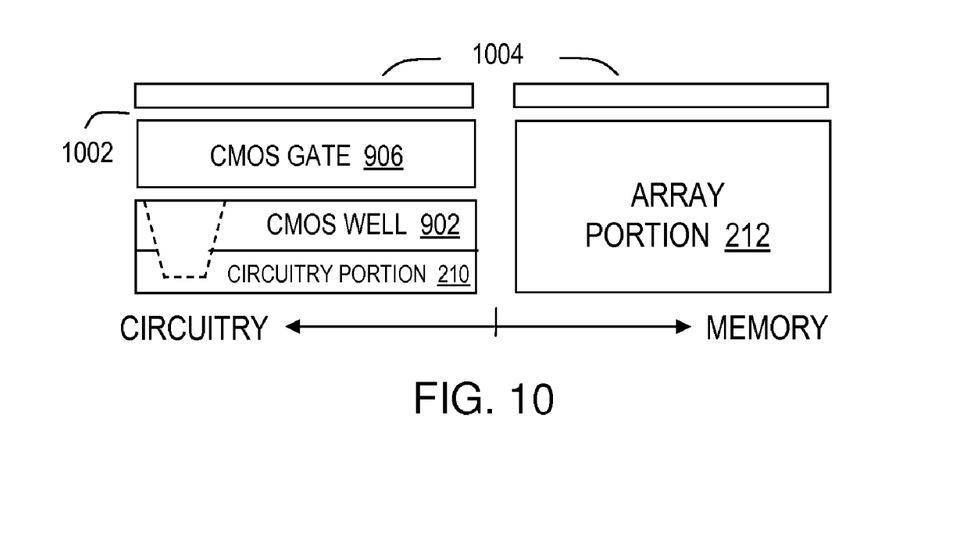
FIG. 10 shows CMOS gate poly-silicon removed from the array portion and a buffer oxide and a nitride hard mask deposited over both the circuitry portion and the array portion.

FIG. 10 shows the CMOS gate poly-silicon 906 removed from the array portion 212 and a buffer oxide 1002 and a STI nitride hard mask 1004 deposited over both circuitry portion 210 and array portion 212.

Figure 11:
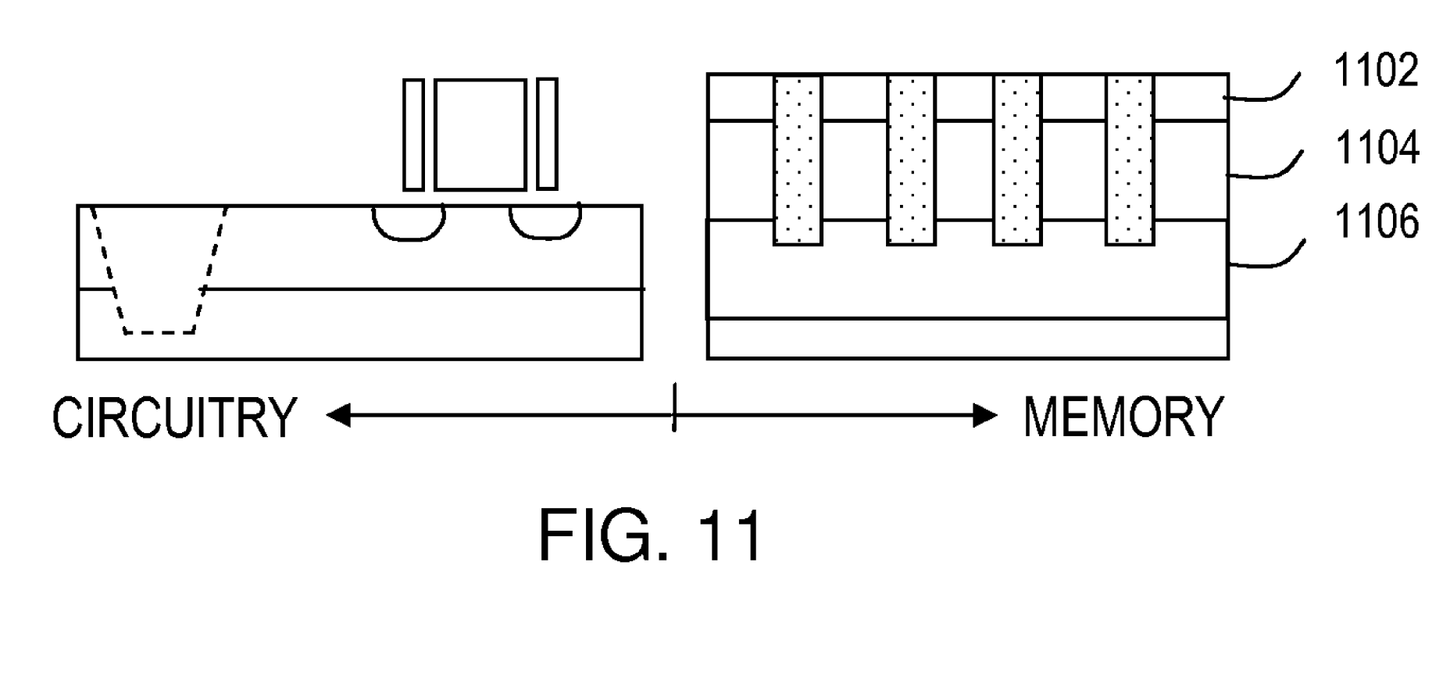
FIG. 11 shows the process in the memory array portion to form the bipolar junctions for the Bipolar Junction Transistor (BJT) selector devices.

FIG. 11 illustrates the STI process in the memory array portion 212 that form the emitter 1102, the base 1104, and the collector 1106 of the bipolar junctions for the Bipolar Junction Transistor (BJT) selectors. On the circuitry portion 210, CMOS poly patterning, Lightly Doped Drain (LDD) junction formation, spacer and source/drain junction formation form the gates to provide logic functionality.

By now it should be apparent that by applying the process flow in accordance with the present invention, the top of the BJT array and the top of the CMOS circuitry may be fabricated at approximately the same level at the end of the front end process flow, thus guaranteeing the required planarity for the memory cell and the Back End Of Line (BEOL) integration. CMOS devices may be formed in a circuitry portion and junction devices may be formed on the array portion with sufficient planarity. The recession described herein allows heater formation and calchogenide definition in the memory cell, as well as metal layers and contacts for interconnecting the active components fabricated on the wafer without adding further expensive planarization layers and/or additional tight pitch contacts. The recession further allows the memory cell to be built directly on the emitter region without being connected to it by a further contact level.

While certain features of the invention have been illustrated and described herein, many modifications, substitutions, changes, and equivalents will now occur to those skilled in the art. It is, therefore, to be understood that the appended claims are intended to cover all such modifications and changes as fall within the true spirit of the invention.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

The invention claimed is:

1. A Phase Change Memory (PCM) device, comprising:
a substrate;
an array portion formed on the substrate, the array portion including memory storage and junction devices; and
a circuitry portion including complementary metal-oxide semiconductor (CMOS) combinational logic devices, the circuitry portion being at least partially recessed into the substrate.

2. The PCM device of claim 1, wherein the circuitry portion includes a gate oxide and a polysilicon gate, the gate oxide and the polysilicon gate having a thickness that substantially matches an amount that the circuitry portion is recessed into the substrate.

3. The PCM device of claim 1 wherein a height that the circuitry portion is recessed below a surface of the array portion provides sufficient planarity to further allow metal layers and contacts to interconnect active components.

4. The PCM device of claim 1 wherein the junction devices are a Bipolar Junction Transistor (BJT) array having a top approximately at a same level as a top of the CMOS circuitry at an end of a front end process flow.

5. A device, comprising:
a selector junction device formed on a substrate, the selector junction device being coupled to a phase change material in a Phase Change Memory (PCM); and
a complementary metal-oxide semiconductor (CMOS) section embedded with the PCM, the CMOS section being recessed into the substrate by a height that substantially matches a height of a gate oxide and a polysilicon gate to provide planarity of an uppermost portion of the CMOS section with an uppermost portion of the PCM.

6. The device of claim 5, wherein the CMOS section includes a multiple core processor section.

7. The device of claim 5 wherein the selector junction device is a Bipolar Junction Transistor (BJT) having an emitter coupled to the phase change material.

8. The device of claim 7 wherein an end portion of a storage array that includes the BJT and phase change material and an end portion of the CMOS section are fabricated at approximately a same level at an end of a front end process flow to provide planarity prior to a Back End Of Line (BEOL) integration.

9. A wireless communications device, comprising:
a transceiver to receive a modulated signal;
a Phase-Change Memory (PCM) portion having memory cells with a selector Bipolar Junction Transistor (BJT) device coupled to a phase change material, the PCM portion formed on a surface of a substrate; and
a complementary metal-oxide semiconductor (CMOS) logic portion having multiple processor cores embedded with the PCM portion that is coupled to the transceiver to receive the modulated signal, the CMOS logic portion being recessed below the surface of the substrate by a gate structure height as measured by a thickness of a gate oxide and a polysilicon gate.

10. The wireless communications device of claim 9, wherein the CMOS portion is recessed to provide substantial planarity of an uppermost surface of the CMOS logic portion with an uppermost surface of the PCM portion prior to any metal layers being formed.

11. The Phase Change Memory (PCM) device of claim 1, wherein the junction devices comprise selectors to select one or more memory cells within the memory array portion.

12. The Phase Change Memory (PCM) device of claim 1, wherein the substrate comprises silicon.

13. The device of claim 5, wherein a depth the CMOS section is recessed below a surface of the substrate is substantially equal to a thickness of a gate oxide and a polysilicon gate to provide planarity for metal layers between the CMOS section and the PCM.

* * * * *